US007084681B2

(12) United States Patent
Green et al.

(10) Patent No.: US 7,084,681 B2
(45) Date of Patent: Aug. 1, 2006

(54) PLL LOCK DETECTION CIRCUIT USING EDGE DETECTION AND A STATE MACHINE

(75) Inventors: Michael Green, Carlsbad, CA (US); Nhat M. Nguyen, San Jose, CA (US); Yohan Frans, Palo Alto, CA (US); Dennis Kim, San Francisco, CA (US); Todd Bystrom, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/088,152

(22) Filed: Mar. 23, 2005

(65) Prior Publication Data

US 2005/0162199 A1 Jul. 28, 2005

Related U.S. Application Data

(63) Continuation of application No. 10/622,627, filed on Jul. 17, 2003, now Pat. No. 6,879,195.

(51) Int. Cl.
*H03L 7/06* (2006.01)

(52) U.S. Cl. ...................................... 327/147; 327/156

(58) Field of Classification Search ................ 327/147, 327/156, 163; 331/17, 25, DIG. 2; 375/373, 375/375, 376
See application file for complete search history.

(56) References Cited

U.S. PATENT DOCUMENTS

| 4,499,434 | A | 2/1985 | Thompson | 331/17 |
|---|---|---|---|---|
| 5,394,444 | A | 2/1995 | Silvey et al. | 375/374 |
| 5,790,613 | A | 8/1998 | Tateishi | 375/376 |
| 6,115,438 | A | 9/2000 | Andresen | 375/373 |
| 6,441,691 | B1 | 8/2002 | Jones et al. | 331/25 |
| 6,466,058 | B1 | 10/2002 | Goldman | 327/49 |
| 6,794,944 | B1 * | 9/2004 | Hirai | 331/1 A |
| 2002/0180540 | A1 | 12/2002 | Hirai | 331/100 |

\* cited by examiner

*Primary Examiner*—Linh My Nguyen
(74) *Attorney, Agent, or Firm*—Silicon Edge Law Group LLC; Arthur J. Behiel; Darien K. Wallace

(57) ABSTRACT

A lock detection circuit operatively associated with a phase-locked loop indicates when a feedback clock signal is locked to a reference clock signal. The lock detection circuit counts the number of rising and falling edges of the feedback clock signal that are detected between rising edges of the reference clock cycle. The lock detection circuit counts the number of consecutive valid cycles of the reference clock signal during which a single rising edge and a single falling edge of the feedback clock signal are detected. Lock detection circuit uses a state machine to assert a lock signal when the number of consecutive valid cycles counted exceeds a predetermined number. Where the lock detection circuit indicates locked signals and then detects a reference clock cycle that is not valid, the lock detection circuit continues to indicate lock if the next reference clock cycle is valid relative to a skewed feedback clock signal.

16 Claims, 8 Drawing Sheets

STATES OF VALID
CYCLE COUNTER

| CURRENT STATE | INPUT SIGNALS | waitOutLock SIGNAL | NEXT STATE | OUTPUT VALUES |
|---|---|---|---|---|
| 0 0 1 | 0 0 0 | X | 0 0 1 | 0 0 1 |
| 0 0 1 | 0 0 1 | X | 0 0 1 | 0 0 1 |
| 0 0 1 | 0 1 0 | X | 0 1 0 | 0 0 1 |
| 0 0 1 | 0 1 1 | X | 0 1 0 | 0 0 1 |
| 0 0 1 | 1 0 0 | X | 0 0 1 | 0 0 1 |
| 0 0 1 | 1 0 1 | X | 0 0 1 | 0 0 1 |
| 0 0 1 | 1 1 0 | X | 0 1 0 | 0 0 1 |
| 0 0 1 | 1 1 1 | X | 0 1 0 | 0 0 1 |
| 0 1 0 | 0 0 0 | X | 0 1 0 | 0 1 0 |
| 0 1 0 | 0 0 1 | X | NOT POSSIBLE | 0 1 0 |
| 0 1 0 | 0 1 0 | X | NOT POSSIBLE | 0 1 0 |
| 0 1 0 | 0 1 1 | X | NOT POSSIBLE | 0 1 0 |
| 0 1 0 | 1 0 0 | X | 1 0 0 | 0 1 0 |
| 0 1 0 | 1 0 1 | X | NOT POSSIBLE | 0 1 0 |
| 0 1 0 | 1 1 0 | X | NOT POSSIBLE | 0 1 0 |
| 0 1 0 | 1 1 1 | X | NOT POSSIBLE | 0 1 0 |
| 1 0 0 | 0 0 0 | 0 | 1 0 0 | 1 0 0 |
| 1 0 0 | 0 0 1 | 0 | 1 0 0 | 1 0 0 |
| 1 0 0 | 0 1 0 | 0 | NOT POSSIBLE | 1 0 0 |
| 1 0 0 | 0 1 1 | 0 | NOT POSSIBLE | 1 0 0 |
| 1 0 0 | 1 0 0 | 0 | 1 0 0 | 1 0 0 |
| 1 0 0 | 1 0 1 | 0 | 0 0 1 | 1 0 0 |
| 1 0 0 | 1 1 0 | 0 | NOT POSSIBLE | 1 0 0 |
| 1 0 0 | 1 1 1 | 0 | NOT POSSIBLE | 1 0 0 |
| 1 0 0 | 0 0 0 | 1 | 0 1 0 | 1 0 0 |
| 1 0 0 | 0 0 1 | 1 | 0 1 0 | 1 0 0 |
| 1 0 0 | 0 1 0 | 1 | NOT POSSIBLE | 1 0 0 |
| 1 0 0 | 0 1 1 | 1 | NOT POSSIBLE | 1 0 0 |
| 1 0 0 | 1 0 0 | 1 | 1 0 0 | 1 0 0 |
| 1 0 0 | 1 0 1 | 1 | 0 0 1 | 1 0 0 |
| 1 0 0 | 1 1 0 | 1 | NOT POSSIBLE | 1 0 0 |
| 1 0 0 | 1 1 1 | 1 | NOT POSSIBLE | 1 0 0 |

| waitForLock noLock lock | validCycle (42) noValidCyc fullCount | | waitForLock noLock lock | waitForLock noLock lock |

PLL LOCK DETECTION CIRCUIT USING EDGE DETECTION AND A STATE MACHINE

CROSS REFERENCE TO RELATED APPLICATION

This application is a continuation of, and claims priority under 35 U.S.C. §120 from, nonprovisional U.S. patent application Ser. No. 10/622,627 entitled "PLL Lock Detection Circuit Using Edge Detection," filed on Jul. 17, 2003, now U.S. Pat. No. 6,879,195, the subject matter of which is incorporated herein by reference.

TECHNICAL FIELD

This patent document relates to phase-locked loops, and more particularly, to methods and circuits for determining when a feedback clock is locked to a reference clock.

BACKGROUND INFORMATION

A phase-locked loop (PLL) compares the phase difference between a reference clock signal and a feedback clock signal and adjusts the frequency of the feedback clock signal to synchronize the clock signals. The frequency of the feedback clock signal locks to the frequency of the reference clock signal. Various circuits exist for determining when the clock signals are locked. A conventional way to determine when a feedback clock signal is locked to a reference clock signal involves counting the cycles of the feedback clock signal during the time it takes to count a predetermined number of cycles of the reference clock signal. The feedback clock signal and the reference clock signal are considered to be locked when the difference between the cycle count of the feedback clock signal and the predetermined number of cycles of the reference clock signal falls within a desired range.

FIG. 1 (prior art) illustrates a conventional lock detector 10 operatively associated with a phase-locked loop (PLL) 11. PLL 10 includes a phase detector 12, a charge pump 13, a loop filter 14, a voltage-controlled oscillator (VCO) 15 and a frequency divider 16. Phase detector 12 compares the phase of a feedback clock signal (FBCKL) 17 to the phase of a reference clock signal (REFCLK) 18. Depending on the phase difference, phase detector 12 outputs up and down control signals causing charge pump 13 to add charge to and subtract charge from its output lead. The voltage on the output lead of charge pump 13, after being filtered by loop filter 14, becomes the control voltage for VCO 15. VCO 15 outputs an output clock signal 19 having a higher frequency when the control voltage increases and a lower frequency when the control voltage decreases. Frequency divider 16 receives output clock signal 19, divides signal 19 down to a lower frequency, and outputs FBCKL 17.

Lock detector 10 includes a feedback latch 20, a reference latch 21, a feedback counter 22, a reference counter 23 and a match detector 24. Feedback latch 20 receives FBCLK 17 and outputs an indication of each rising edge of FBCLK 17. Feedback counter 22 counts the number of rising edges indicated by feedback latch 20 and sends count signals indicative of the current total count to match detector 24. Reference latch 21 receives REFCLK 18 and outputs an indication of each rising edge of REFCLK 18. Reference counter 23 receives the output of reference latch 21 and counts the number of rising edges up to a predetermined number. When the count reaches the predetermined number, reference counter 23 sends a freeze signal to match detector 24. At the moment match detector 24 receives the freeze signal, match detector 24 determines the difference between the current total count indicated by the last count signal and the predetermined number counted by reference counter 23.

Match detector 24 outputs a lock detect signal 25 indicating whether FBCLK 17 is locked to REFCLK 18, and by inference indicating that PLL output clock signal 19 is an exact, predefined, multiple of REFCLK 18. For example, lock detect signal 25 can be a digital one indicating "lock" or a digital zero indicating "out of lock." Where reference counter 23 is set to count eighteen cycles of REFCLK 18, match detector 24 outputs signal 25 indicating "lock" when seventeen, for example, is the value of the last count signal received from feedback counter 22 immediately prior to receiving a freeze signal from reference counter 23. Match detector 24 outputs signal 25 indicating "out of lock" when feedback counter 22 counts, for example, sixteen cycles of FBCLK 17 during the time it takes for reference counter 23 to count eighteen cycles of REFCLK 18. Thus, in this example, lock detector 10 indicates that FBCLK 17 is locked to REFCLK 18 when the average frequency of FBCLK 17 varies by less than $2/18^{ths}$ of the frequency of REFCLK 18.

FIG. 2 (prior art) illustrates a shortcoming of lock detector 10. Lock detector 10 indicates that two signals are locked based on the average number of rising edges of those signals over a period of time, even where those signals have different frequencies during portions of that period of time. Over a first time period 26, lock detector 10 indicates that FBCLK 17 and REFCLK 18 are locked. During the beginning and end portions of time period 26, however, FBCLK 17 has a lower frequency than REFCLK 18. During the middle portion, FBCLK 17 has a higher frequency. If data is transmitted on PLL output clock signal 19 because lock detector 10 indicates that FBCLK 17 and REFCLK 18 are locked, the fluctuations in frequency of FBCLK 17, and therefore of the frequency of output clock signal 19, can cause unreliable data transmission. Lock detector 10 also indicates that FBCLK 17 and REFCLK 18 are locked over a second time period 27 (and by inference that the PLL output clock signal 19 is an exact, predefined and stable multiple of REFCLK 18), even though the frequency of FBCLK 17 (and therefore output clock signal 19) is not stable over the second time period 27.

Because only average frequencies of clock signals are compared, the reference and feedback clock signals are counted for a relatively long period of time to increase the probability that the feedback clock signal is stable and, therefore, truly locked. The predetermined count number of reference clock cycles is typically much greater than eighteen and can undesirably delay circuit startup time. Thus, lock detector 10 reliably indicates whether two signals are locked only after the relatively long period of time, for example, five hundred twelve reference clock cycles. Moreover, where lock detector 10 counts for five hundred twelve cycles of REFCLK 18, both reference counter 23 and feedback counter 22 are physically large counter circuits that occupy valuable space on a semiconductor die.

A circuit is thus desired that detects when two clock signals are locked and does not indicate frequency lock based on the average frequency of each clock signal over a period of time.

SUMMARY

A lock detection circuit operatively associated with a phase-locked loop detects when a feedback clock signal is locked to a reference clock signal. The lock detection circuit counts the number of rising and falling edges of the feedback clock signal that are detected between rising edges of the reference clock cycle. The lock detection circuit then counts the number of consecutive valid cycles of the reference clock signal during which a single rising edge and a single falling edge of the feedback clock signal are detected. The lock detection circuit asserts a lock signal when the number of consecutive valid cycles counted exceeds a predetermined number.

The lock detection circuit has three states: no lock, wait for lock, and lock. When the lock detection circuit is in the lock state and detects a reference clock cycle that is not valid, the lock detection circuit remains in the lock state if a single rising edge and a single falling edge of a skewed feedback clock signal are detected during the next reference clock cycle. The lock detection circuit then continues to detect whether the skewed feedback clock signal is locked to the reference clock signal.

A method of operation of the lock detection circuit is disclosed in which the lock detection circuit passes among three states depending on the number of rising and falling edges of the feedback clock signal detected between rising edges of the reference clock signal. The lock detection circuit attains the wait-for-lock and lock states based on the detected edges of both the reference clock and a skewed reference clock.

Embodiments and additional novel aspects are described in the detailed description below. The allowed claims, and not this summary, define the scope of the invention.

BRIEF DESCRIPTION OF THE DRAWINGS

The accompanying drawings, where like numerals indicate like components, illustrate embodiments of the invention.

FIG. 7 is a state table listing possible states of a valid cycle counter in accordance with one embodiment.

DETAILED DESCRIPTION OF THE DRAWINGS

Figure 1:
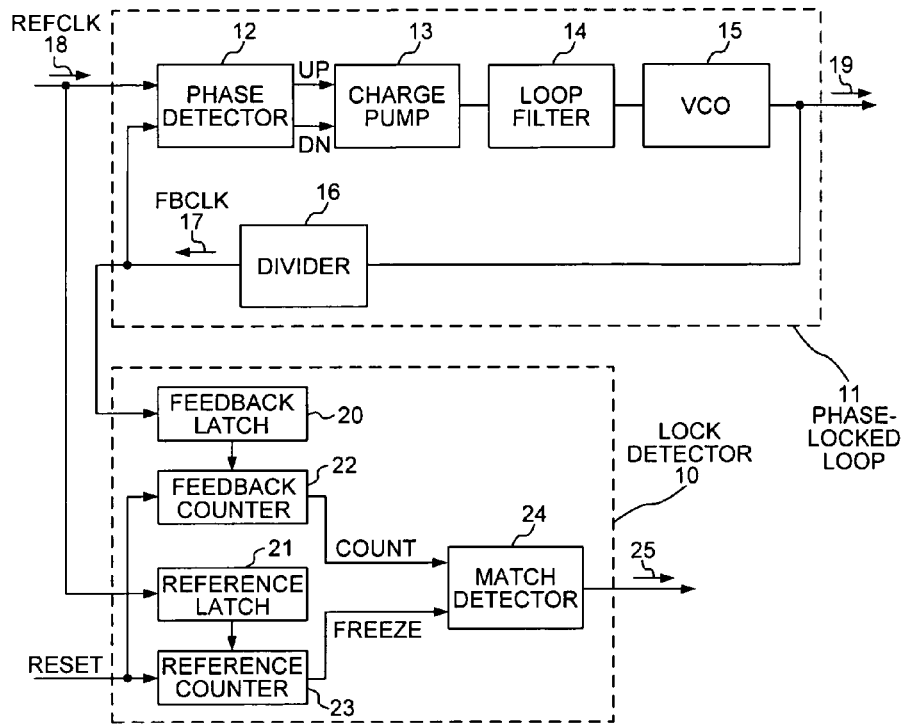
FIG. 1 (prior art) is a simplified block diagram of a lock detector and a phase-locked loop of the prior art.
Figure 2:
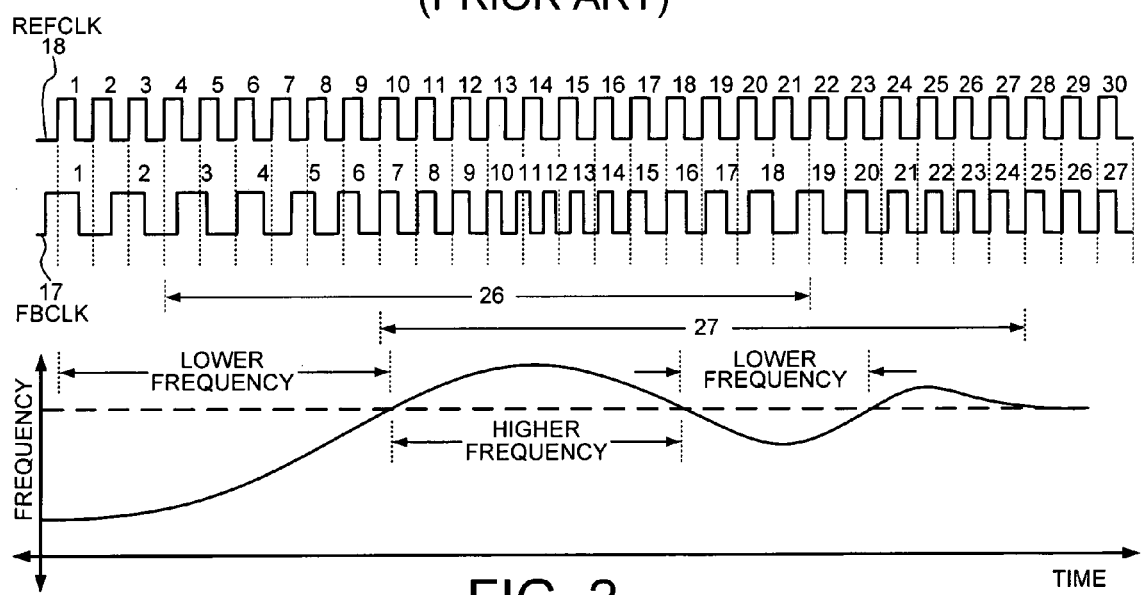
FIG. 2 (prior art) is a waveform diagram of reference and feedback clock signals that are determined to be locked using the prior art lock detector of FIG. 1.
Figure 3:
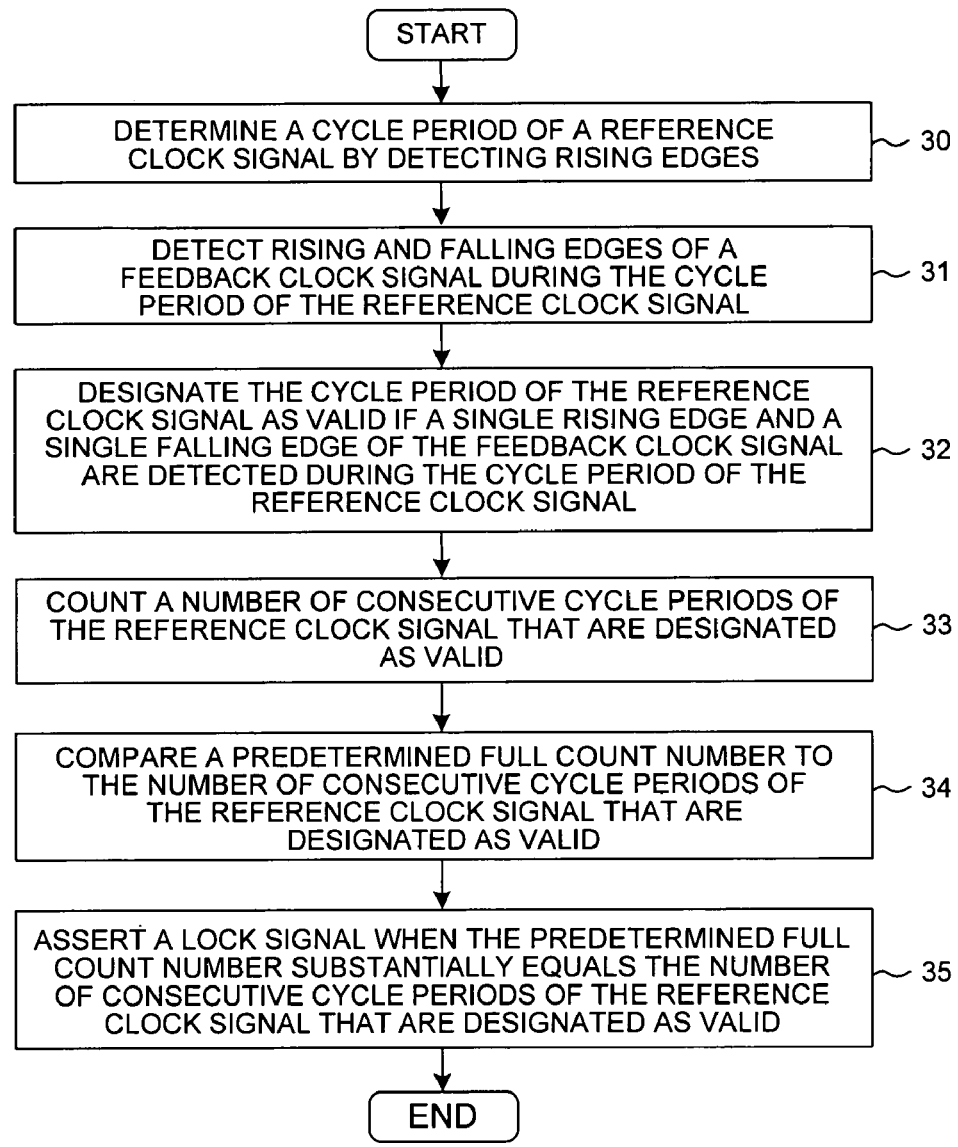
FIG. 3 is a flowchart of steps for detecting whether a feedback clock is locked to a reference clock.
Figure 4:
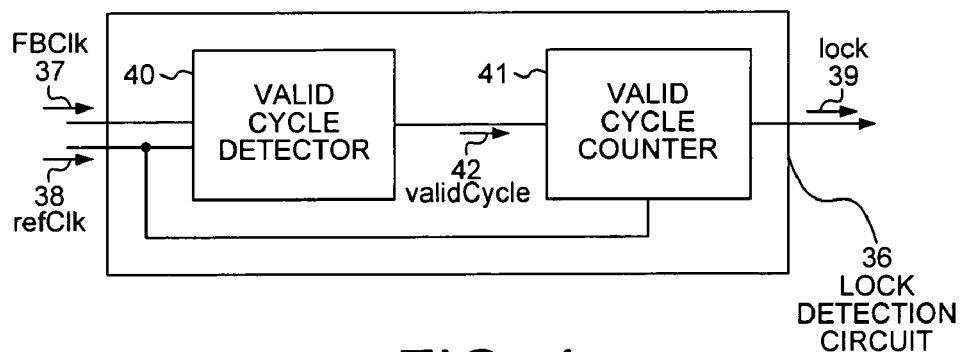
FIG. 4 is a simplified block diagram of a lock detection circuit in accordance with one embodiment.

FIG. 3 is a flowchart showing steps 30–35 of a method for detecting whether a feedback clock signal is locked to a reference clock signal. FIG. 4 is a simplified diagram of a lock detection circuit 36 that carries out the method of FIG. 3. The various signal labels refer to both the signal and the corresponding circuit node. Whether a given designation refers to a node or a signal will be clear from the context.

Lock detection circuit 36 includes a valid cycle detector 40 and a valid cycle counter 41. Valid cycle detector 40 receives a feedback clock signal (FBClk) 37 and a reference clock signal (refClk) 38 and determines the cycle periods of refClk 38 by detecting rising edges of refClk 38 (step 30). Valid cycle detector 40 detects (step 31) rising and falling edges of FBClk 37 during a cycle period of refClk 38. Valid cycle detector 40 designates (step 32) the cycle period of refClk 38 as "valid" if a single rising edge and a single falling edge of FBClk 37 are detected between successive rising edges of refClk 38. A valid cycle signal (validCycle) 42 is output by valid cycle detector 40 and is supplied to valid cycle counter 41. Valid cycle counter 41 counts (step 33) the number of consecutive cycle periods of refClk 38 that are designated as valid. If the number of consecutive valid cycle periods as determined by valid cycle counter 41 (step 34) equals a predetermined number, then the valid cycle counter 41 asserts (step 35) a lock signal 39.

Figure 5:
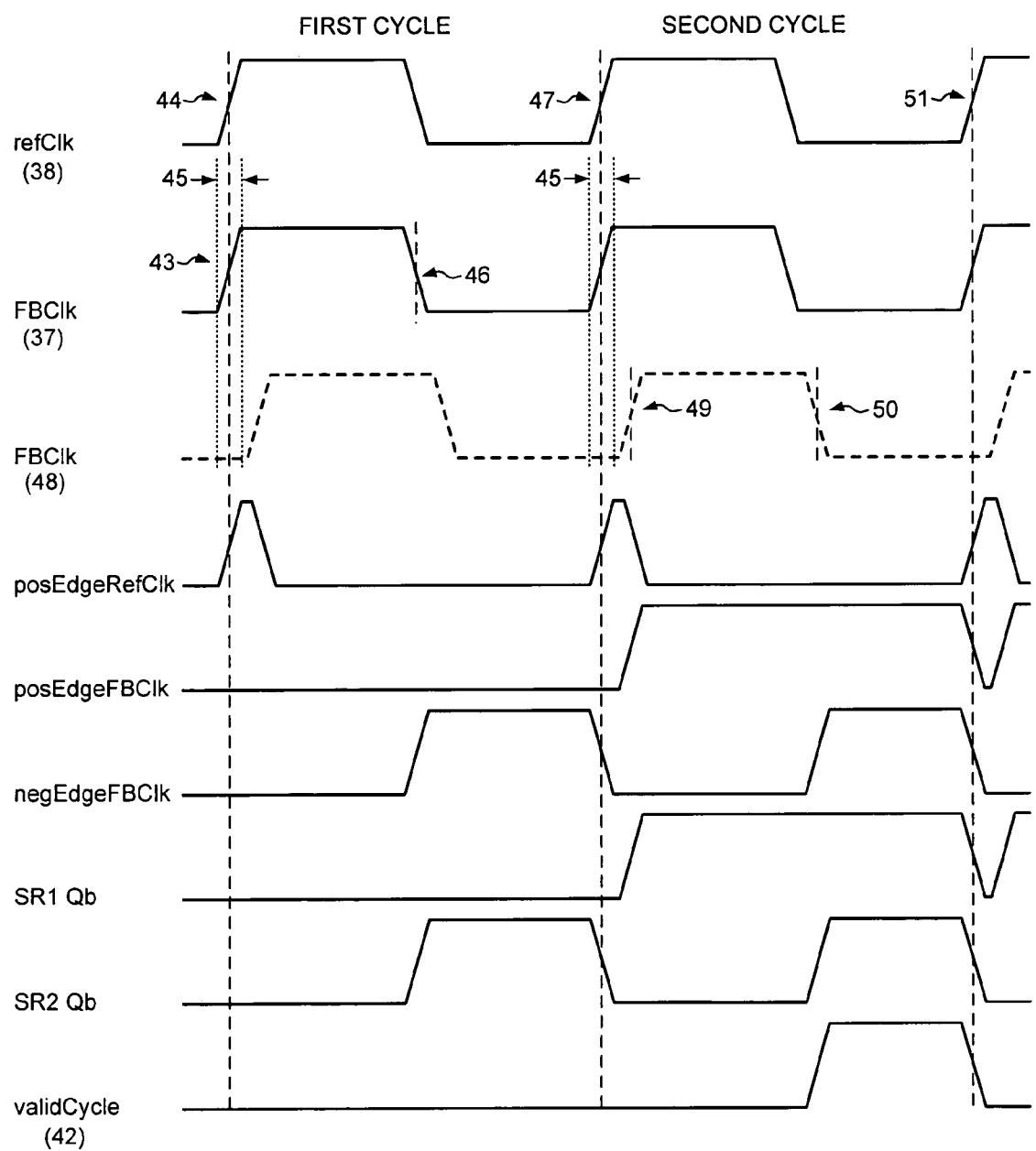
FIG. 5 is a waveform diagram of signals present on nodes of the lock detection circuit of FIG. 3.

FIG. 5 shows waveforms of various signals on nodes of valid cycle detector 40. The waveforms illustrate when valid cycle detector 40 asserts validCycle signal 42 for two sample cycles of refClk 38. In the first sample cycle, refClk 38 and FBClk 37 have the same frequency and phase. A rising edge 43 of FBClk 37 occurs at the same time as a rising edge 44 of refClk 38. Valid cycle detector 40 detects rising edges of refClk 38 using a flip-flop that exhibits a setup and hold time 45. Valid cycle detector 40 might detect rising edge 43 during setup and hold time 45. On the other hand, during setup and hold time 45, valid cycle detector 40 might not detect rising edge 43 of FBClk 37 due to a setup-and-hold violation, in which case posEdgeFBClk signal would not be asserted. Thus, valid cycle detector 40 would detect only a falling edge 46 of FBClk 37 between rising edge 44 and an immediately following rising edge 47 of refClk 38. negEdgeFBClk, but not posEdgeFBClk, would thus be asserted for the first sample cycle. No validCycle signal 42 would be asserted because valid cycle detector 40 would not detect a single rising edge and a single falling edge of FBClk 37 between successive rising edges of refClk 38.

After a cycle of refClk 38 for which validCycle signal 42 has not been asserted, lock detection circuit 36 delays FBClk 37 to produce a skewed FBClk 48. A rising edge 49 of skewed FBClk 48 occurs after setup and hold time 45. For the second sample cycle of refClk 38, valid cycle detector 40 detects rising edge 49 of skewed FBClk 48, and posEdgeFBClk signal is asserted. Valid cycle detector 40 detects rising edge 49 and a falling edge 50 of skewed FBClk 48 between rising edge 47 and an immediately following rising edge 51 of refClk 38. Because both posEdgeFBClk and negEdgeFBClk are asserted for the second sample cycle, validCycle signal 42 is asserted.

When FBClk 37 and refClk 38 have the same frequency, valid cycle detector 40 will assert validCycle signal 42 only if FBClk 37 is phase shifted by an amount greater than setup and hold time 45 and less than half the reference clock cycle period minus the setup and hold time 45. Thus, half a cycle period of refClk 38 minus the setup and hold time 45 is the maximum phase shift for which lock detection circuit 36 will indicate that two signals of the same frequency are locked.

Figure 6:
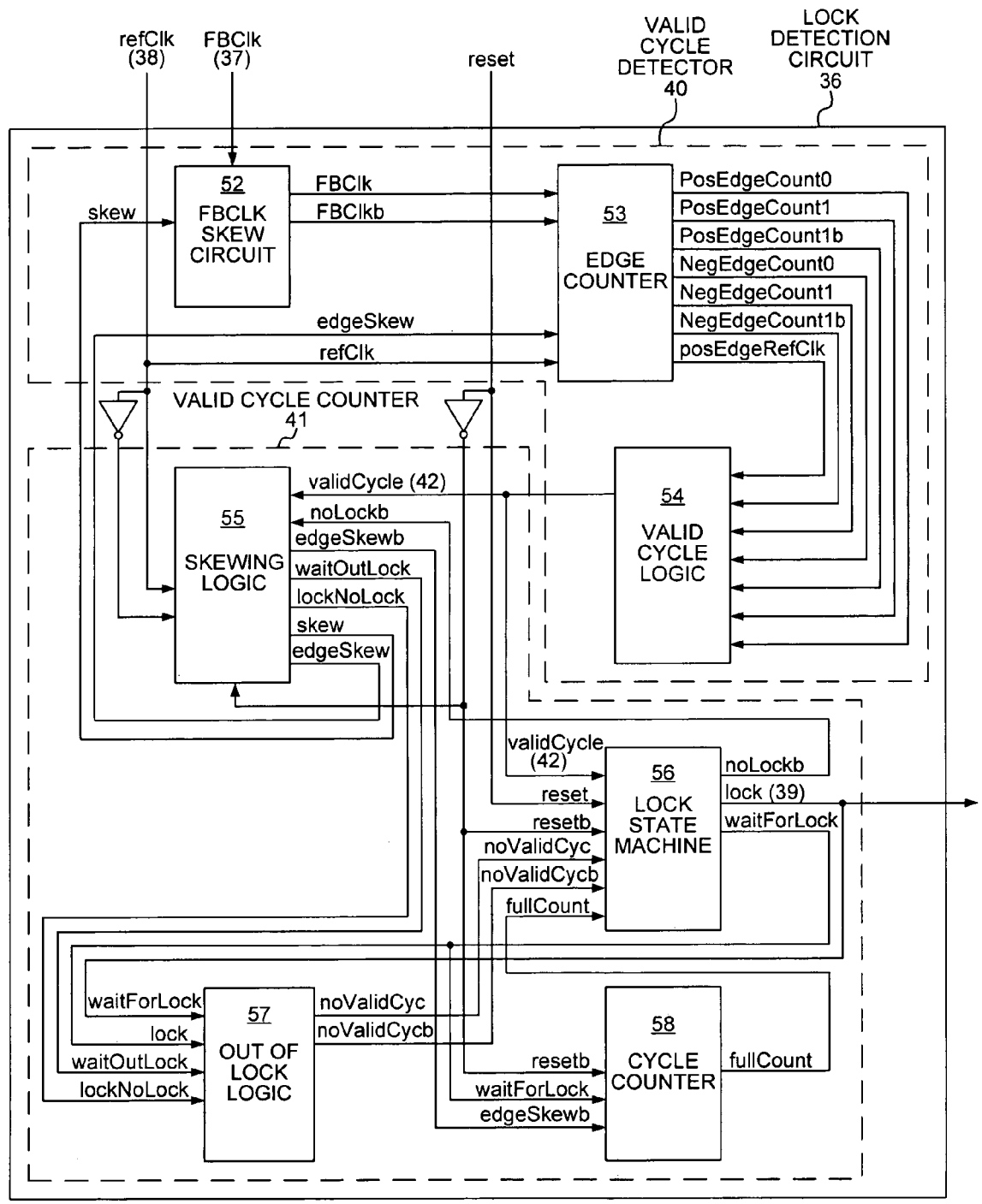
FIG. 6 is a simplified block diagram of one specific embodiment of the lock detection circuit of FIG. 3.

FIG. 6 shows valid cycle detector 40 and valid cycle counter 41 of one specific embodiment of lock detection circuit 36 in more detail. Valid cycle detector 40 includes a FBClk skew circuit 52, an edge counter 53 and valid cycle logic 54. Valid cycle counter 41 includes skewing logic 55, a lock state machine 56, out of lock logic 57 and a cycle counter 58. FIG. 6 also shows signal paths between the components of lock detection circuit 36. FBClk skew circuit 52 receives FBClk 37 and outputs either FBClk 37 or skewed FBClk 48, depending on the value of a skew signal that FBClk skew circuit 52 receives from skewing logic 55. In each case, FBClk skew circuit 52 also outputs the inverted signals FBClkb or skewed FBClkb.

Edge counter 53 receives refClk 38, as well as either FBClk 37 or skewed FBClk 48. Edge counter 53 counts the rising and falling edges of FBClk 37 or skewed FBClk 48 that occur between consecutive rising edges of refClk 38. Valid cycle logic 54 receives signals from edge counter 53 indicative of the number of rising and falling edges of either FBClk 37 or skewed FBClk 48, as the case may be, and asserts validCycle signal 42 after edge counter 53 has counted a single rising edge and a single falling edge of either FBClk 37 or skewed FBClk 48.

Valid cycle logic 54 outputs validCycle signal 42 to valid cycle counter 41. Both skewing logic 55 and lock state machine 56 of valid cycle counter 41 receive validCycle signal 42 from valid cycle logic 54. Valid cycle counter 41 passes through various states depending both on the number of consecutive refClk 38 cycles for which validCycle signal 42 is asserted, as well as on whether validCycle signal 42 is asserted in relation to FBClk 37 or skewed FBClk 48. Lock state machine 56 passes through three states depending on the value of three signals received by lock state machine 56 and the value of a waitOutLock signal received by out of lock logic 57. The three input signals of lock state machine 56 that control the states are: a noValidCyc signal, a fullCount signal and validCycle signal 42. The three states of lock state machine 56 are: no lock, wait for lock and lock.

Cycle counter 58 increments for each valid cycle that occurs during the wait-for-lock state. When the maximum value of cycle counter 58 has been attained, cycle counter 58 asserts the fullCount signal, which passes valid cycle counter 41 into the lock state.

FIG. 7 is a state table listing the possible states of valid cycle counter 41 as a function of the noValidCyc signal, the fullcount signal and validCycle signal 42, as well as of the waitOutLock signal.

Figure 8:
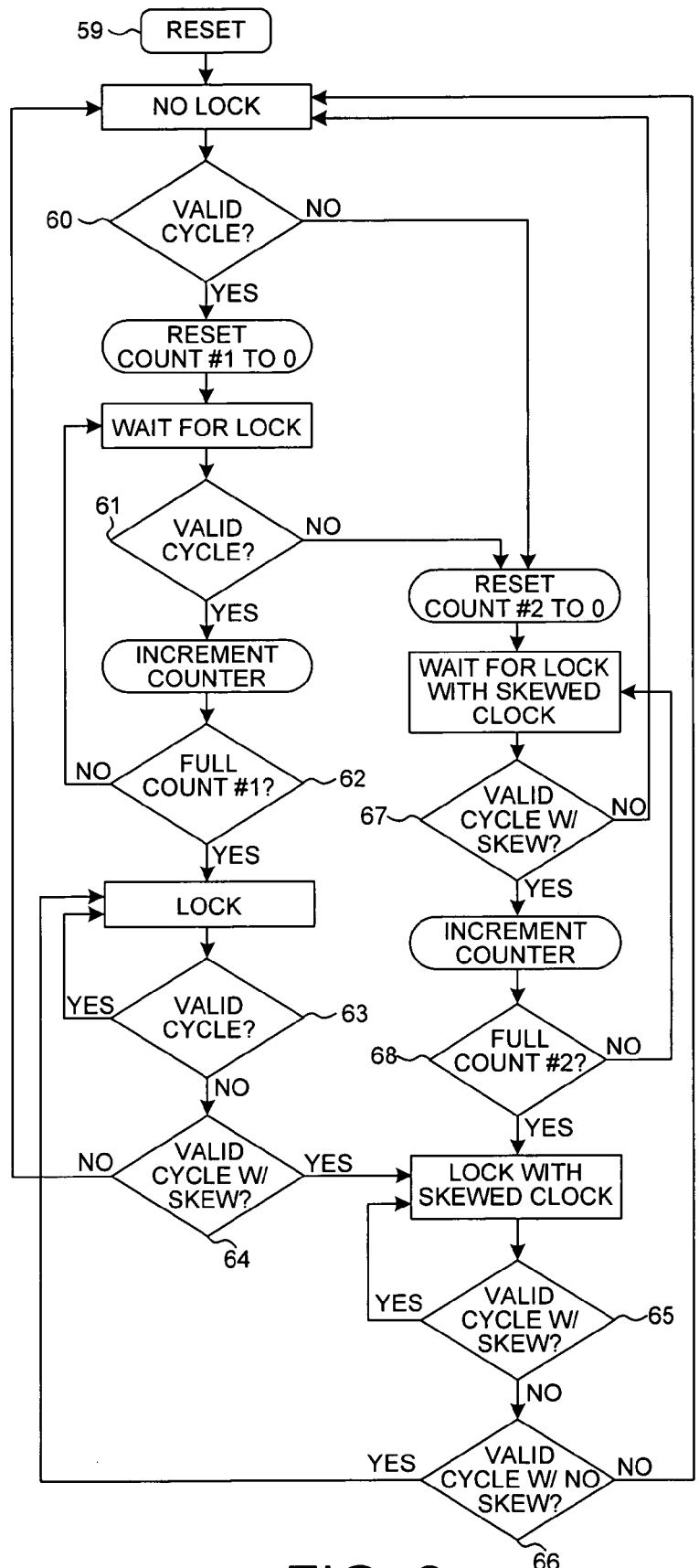
FIG. 8 is a flowchart of a method in accordance with one embodiment.

FIG. 8 illustrates the operation of valid cycle counter 41 by showing steps for passing among the states: no lock, wait for lock and lock. In a first step 59, a reset signal passes valid cycle counter 41 into the no-lock state. In a next step 60 that occurs during a successive cycle of refClk 38, valid cycle counter 41 passes into the wait-for-lock state if validCycle signal 42 is asserted. In a step 61, if validcycle signal 42 is asserted during the next cycle of refClk 38, cycle counter 58 increments and counts a first valid cycle. In a step 62, if the incremented count of cycle counter 58 is the maximum value of cycle counter 58, valid cycle counter 41 passes into the lock state. If the incremented count in step 62 is not the maximum value of cycle counter 58, valid cycle counter 41 remains in the wait-for-lock state and returns to step 61. If validCycle signal 42 is again asserted in step 61, cycle counter 58 increments and counts a second valid cycle. Each time validCycle signal 42 is asserted, steps 61 and 62 are repeated until the full count of cycle counter 58 is reached.

In step 63, valid cycle counter 41 remains in the lock state if validCycle signal 42 is asserted during the next cycle of refClk 38. If validCycle signal 42 is not asserted, valid cycle counter 41 remains in the lock state until the next cycle of refClk 38, but then in step 64 determines whether validCycle signal 42 is asserted based on skewed FBClk 48 (as opposed to FBClk 37). If validCycle signal 42 is not asserted based on skewed FBClk 48 in step 64, valid cycle counter 41 passes back into the no lock state, and the operation of valid cycle counter 41 proceeds from step 60. If validCycle signal 42 is asserted in step 64, valid cycle counter 41 remains in the lock state using skewed FBClk 48.

In a step 65, if validCycle signal 42 is asserted during the next cycle of refClk 38, valid cycle counter 41 repeats step 65 and remains in the lock state. If validCycle signal 42 is not asserted in step 65, valid cycle counter 41 remains in the lock state until the next cycle of refClk 38, but then in step 66 determines whether validCycle signal 42 is asserted based on non-skewed FBClk 37 (as opposed to skewed FBClk 48).

In step 66, if validCycle signal 42 is asserted during the next cycle of refClk 38, valid cycle counter 41 remains in the lock state, but returns to step 63 and continues to determine whether validCycle signal 42 is asserted based on non-skewed FBClk 37. If validCycle signal 42 is not asserted in step 66, valid cycle counter 41 passes back into the no lock state, and the operation of valid cycle counter 41 proceeds from step 60.

Returning to step 60, if validCycle signal 42 is not asserted, valid cycle counter 41 nevertheless passes into the wait-for-lock state, but then in a step 67 determines whether validCycle signal 42 is asserted based on skewed FBClk 48. If validCycle signal 42 is not asserted during the next cycle of refClk 38 in step 67, valid cycle counter 41 passes back into the no lock state, and the operation of valid cycle counter 41 proceeds from step 60. If validCycle signal 42 is asserted in step 67, cycle counter 58 increments and counts a first valid cycle using skewed FBClk 48. During the next cycle of refClk 38 in a step 68, if the incremented count of cycle counter 58 is the maximum value of cycle counter 58, valid cycle counter 41 passes into the lock state using skewed FBClk 48. If the incremented count in step 68 is not the maximum value of cycle counter 58, valid cycle counter 41 remains in the wait-for-lock state (using skewed FBClk 48) and returns to step 67. If validCycle signal 42 is again asserted in step 67, cycle counter 58 increments and counts a second valid cycle. In step 68, if the incremented count of cycle counter 58 is the maximum value of cycle counter 58, valid cycle counter 41 passes into the lock state using the skewed FBClk 48 and proceeds with step 65.

Figure 9:
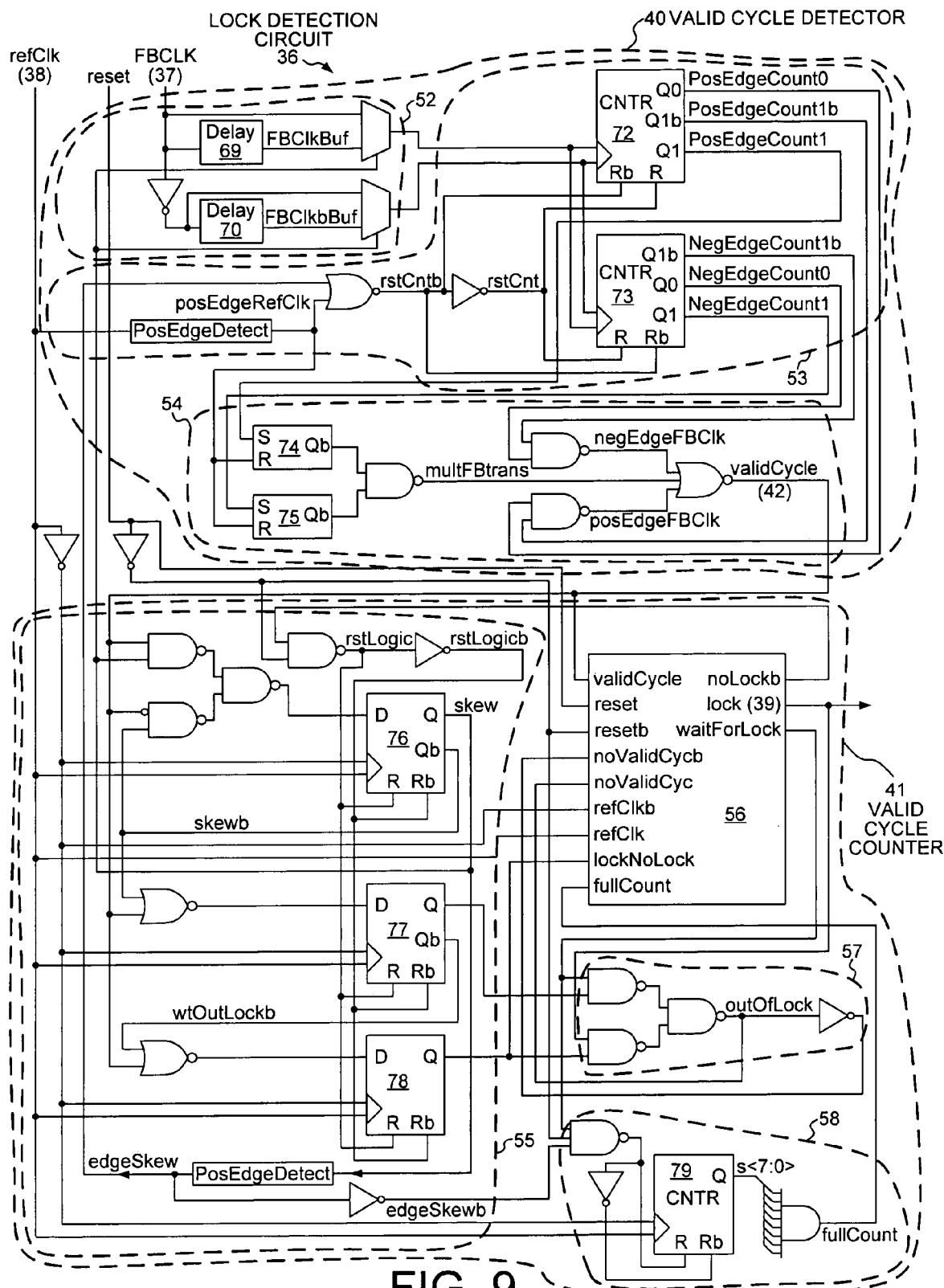
FIG. 9 is a more detailed block diagram of the specific embodiment of the lock detection circuit of FIG. 6.

FIG. 9 is a more detailed block diagram of the specific embodiment of lock detection circuit 36 of FIG. 6. FIG. 9 shows FBClk skew circuit 52, edge counter 53 and valid cycle logic 54 within valid cycle detector 40. FBClk skew circuit 52 has two delay elements 69 and 70 that delay FBClk 37 and FBClkb to generate skewed FBClk 48 and skewed FBClkb, respectively. For example, the delay element 69 delays FBClk 37 by ninety picoseconds to generate skewed FBClk 48. Edge counter 53 includes a first two-bit counter 72 that counts rising edges of FBClk 37 and skewed FBClk 48. Edge counter 53 also includes a second two-bit counter 73 that counts falling edges of FBClk 37 and skewed FBClk 48. Valid cycle logic 54 includes two SR latches 74 and 75. The waveforms labeled SR1Qb and SR2Qb shown in FIG. 5 are output by SR latches 74 and 75, respectively.

Valid cycle counter 41 includes skewing logic 55, lock state machine 56, out of lock logic 57 and cycle counter 58. Skewing logic 55 includes three latches 76–78. Lock state machine 56 includes three flip-flops. Lock state machine 56 passes into the lock state and asserts lock signal 39 when lock state machine 56 receives the fullCount signal from cycle counter 58. Cycle counter 58 includes an eight-bit counter 79 that counts to its maximum count value, the predetermined full count number of two hundred and fifty-six. Counter 79 outputs an eight-bit signal "s<7:0>". Lock signal 39 is asserted when this signal s<7:0> has the maximum count value of two hundred and fifty-six <11111111>, signifying that the full count has been reached.

Figure 10:
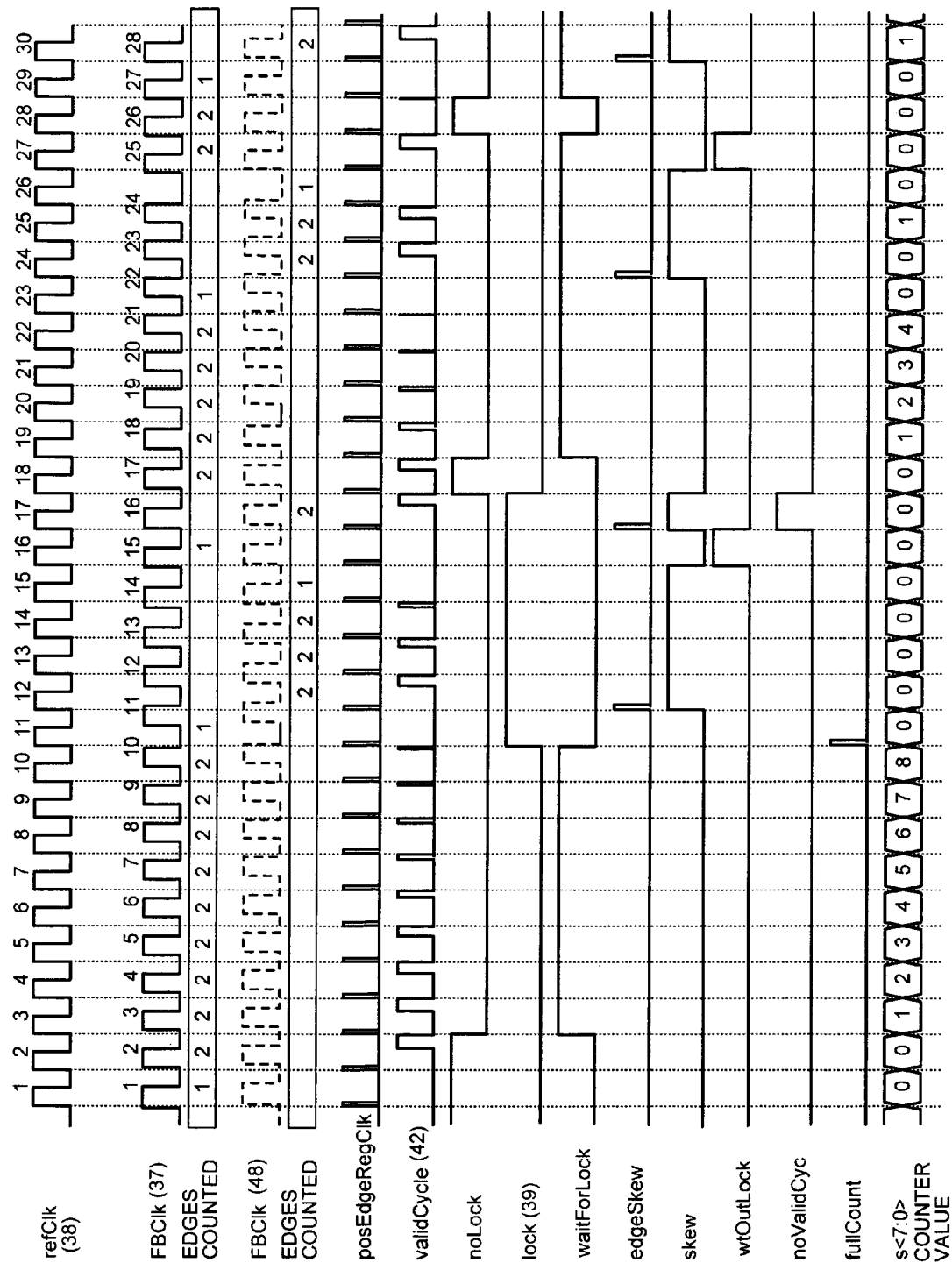
FIG. 10 is a waveform diagram of signals present on nodes of the lock detection circuit of FIG. 3.

FIG. 10 shows waveforms of various signals on nodes of lock detection circuit 36. The waveforms indicate when cycle counter 58 increments and when lock signal 39 is asserted. For purposes of illustration in FIG. 10, the maximum value of cycle counter 58 is eight. Waveforms are shown that result from thirty sample cycles of refClk 38 and twenty-eight sample cycles of FBClk 37. For each successive cycle of refClk 38, the waveforms shown in FIG. 10 illustrate the operation of lock detection circuit 36 according to the steps shown in FIG. 8. The number of edges of FBClk 37 and of skewed FBClk 48 are listed that valid cycle detector 40 counts during each of the thirty sample cycles of refClk 38.

Before the first sample cycle, lock detection circuit 36 is in the no-lock state, and a noLock signal is asserted. In the first sample cycle, validCycle signal 42 is not asserted because only one edge of FBClk 37 is detected. During the second cycle, two edges of FBClk 37 are detected and validCycle signal 42 is asserted. In the next cycle (cycle three), a waitForLock signal is asserted. Cycle counter 58 counts a first valid cycle in cycle three because validCycle signal 42 has been asserted in the wait-for-lock state.

Between the third and the tenth sample cycles, lock detection circuit 36 counts eight valid cycles, and the maximum value of cycle counter 58 is reached in this example where counter 79 is a three-bit counter. Thus, the fullcount signal and the lock signal 39 are asserted in the eleventh sample cycle. The lock signal 39 remains asserted until cycle 18, when it is de-asserted following two consecutive cycles for which validCycle signal 42 was not asserted. In cycle fifteen, validCycle signal 42 is not asserted in the lock state using skewed FBClk 48 (step 65 in FIG. 8). In cycle sixteen, validCycle signal 42 is not asserted in the lock state using non-skewed FBClk 37 (step 66 in FIG. 8). Thus, a noValidCyc signal is asserted in cycle seventeen, and lock signal 39 is de-asserted in cycle eighteen, despite the fact that a valid cycle is detected in cycle seventeen. The valid cycle detected in cycle eighteen (step 60 in FIG. 8) passes lock detection circuit 36 into the wait-for-lock state in cycle nineteen. Therefore, two cycles of refClk 38 elapse between step 66 and step 60 in FIG. 8. Although there have been three consecutive valid cycles, cycle counter 58 counts a first valid cycle in cycle nineteen because validCycle signal 42 has been asserted for the first time in the wait-for-lock state.

Lock detection circuit 36 asserts lock signal 39 based on the number of consecutive valid reference clock cycles, as opposed to the total number of feedback clock cycles that occur during the total duration of a predetermined number of reference clock cycles. Although FIG. 10 shows twenty-two cycles of FBClk 37 occurring during twenty-three cycles of refClk 38, there are only eighteen valid cycles of refClk 38. Thus, lock detection circuit 36 indicates on a cycle-by-cycle basis that FBClk 37 is not as closely locked to refClk 38 as a comparison of FBClk 37 and refClk 38 based on average frequency over a time period would indicate.

In an embodiment where counter 79 is an eight-bit counter, valid cycle counter 41 asserts lock signal 39 after valid cycle detector 40 detects at least two hundred fifty-six consecutive valid cycles. (In the operational steps of FIG. 8, a lock signal is asserted after either two hundred fifty-seven valid cycles or two hundred fifty-eight valid cycles, depending on the number of valid cycles before the wait-for-lock state is attained.) For a sample FBClk 37 having a constant frequency nearly the same as the frequency of refClk 38, counter 79 counts only two hundred fifty-five consecutive valid cycles. In that case, lock detection circuit 36 indicates that FBClk 37 is not locked to refClk 38 even though the frequency of FBClk 37 varies from that of refClk 38 by only $1/256^{th}$. Thus, the embodiment of clock detection circuit 36 where counter 79 is an eight-bit counter has an accuracy of at least 0.4%. The 256th cycle will be valid, however, unless the phase shift between FBClk 37 and refClk 38 is at least half a cycle period of refClk 38 minus the setup and hold time 45. Thus, the accuracy of this embodiment is almost 0.2%.

Although the present invention is described in connection with certain specific embodiments for instructional purposes, the present invention is not limited thereto. Although some embodiments of the lock detection circuit, after having detected an invalid cycle, wait until the next reference clock cycle to check for a valid cycle using a skewed feedback clock signal, other embodiments simultaneously check whether a reference clock cycle is valid in relation to a feedback clock signal as well as a skewed feedback clock signal. Although some embodiments of the lock detection circuit indicate whether a feedback clock signal of a phase-locked loop (PLL) is locked to a reference clock signal, other embodiments indicate whether an output signal of a PLL is an exact, predefined, stable multiple of the reference clock. Although the lock detection circuit is described in connection with PLLs, the lock detection circuit can be operatively associated with delay-locked loops (DLLs) or serializer/deserializers (Serdes). Accordingly, various modifications, adaptations, and combinations of various features of the described embodiments can be practiced without departing from the scope of the invention as set forth in the following claims.

What is claimed is:

1. A circuit comprising:
    an edge counter that counts rising edges and falling edges of a first clock signal; and
    a lock state machine having a lock state, a wait for lock state and a no lock state, wherein the lock state machine passes to the lock state when the first clock signal locks to a second clock signal in the wait-for-lock state, wherein the lock state machine passes to the no-lock state when the first clock signal is no longer locked to the second clock signal in the lock state, wherein the lock state machine passes to the wait for lock state when a valid cycle of the second clock signal occurs in the no-lock state, and wherein the valid cycle occurs when the edge counter counts a single rising edge and a single falling edge of the first clock signal during a cycle period of the second clock signal;
    wherein each of a number of consecutive valid cycles has a cycle period, further comprising:
    a cycle counter that counts the number of consecutive valid cycles of the second clock signal during which a single rising edge and a single falling edge of the first clock signal occur during each of the cycle periods of the consecutive valid cycles of the second clock signal.

2. The circuit of claim 1, wherein the first clock signal is a feedback clock signal and the second clock signal is a reference clock signal.

3. The circuit of claim 1, wherein the first clock signal is a skewed feedback clock signal and the second clock signal is a reference clock signal.

4. The circuit of claim 1, wherein the edge counter detects rising edges of the second clock signal, and wherein the cycle period of the second clock signal occurs from a rising edge of the second clock signal until an immediately following rising edge of the second clock signal.

5. The circuit of claim 1, wherein the lock state machine asserts a lock signal after the first clock signal locks to the second clock signal in the wait-for-lock state.

6. The circuit of claim 1, wherein the circuit is operatively associated with a delay-locked loop.

7. The circuit of claim 1, wherein the first clock signal locks to the second clock signal in the wait-for-lock state when the number of consecutive valid cycles counted by the cycle counter exceeds a predetermined number.

8. The circuit of claim 1, wherein the lock state machine controls when the cycle counter increments.

9. A method comprising:
passing from a wait-for-lock state to a lock state when a first clock signal locks to a second clock signal;
passing from the lock state to a no-lock state when the first clock signal is no longer locked to the second clock signal;
passing from the no-lock state to the wait-for-lock state when a valid cycle of the second clock signal occurs, wherein the valid cycle occurs when a single rising edge and a single falling edge of the first clock signal occur during a cycle period of the second clock signal; and
remaining in the lock state both when the first clock signal is no longer locked to the second clock signal and when a skewed first clock signal locks to the second clock signal.

10. The method of claim 9, wherein the skewed first clock signal locks to the second clock signal when a single rising edge of the skewed first clock signal and a single falling edge of the skewed first clock signal occur during a subsequent cycle period of the second clock signal.

11. The method of claim 9, wherein the first clock signal is a feedback clock signal and the second clock signal is a reference clock signal.

12. The method of claim 9, wherein the first clock signal locks to the second clock signal when a number of consecutive valid cycles of the second clock signal exceeds a predetermined number.

13. A method comprising:
passing from a wait-for-lock state to a lock state when a first clock signal locks to a second clock signal;
passing from the lock state to a no-lock state when the first clock signal is no longer locked to the second clock signal;
passing from the no-lock state to the wait-for-lock state when a valid cycle of the second clock signal occurs, wherein the valid cycle occurs when a single rising edge and a single falling edge of the first clock signal occur during a cycle period of the second clock signal;
wherein the first clock signal locks to the second clock signal when a number of consecutive valid cycles of the second clock signal exceeds a predetermined number; and
counting the number of consecutive valid cycles of the second clock signal.

14. The method of claim 9, wherein the cycle period of the second clock signal occurs from a rising edge of the second clock signal and to an immediately following rising edge of the second clock signal.

15. The method of claim 9, wherein the first clock signal is no longer locked to the second clock signal when a single rising edge and a single falling edge of the first clock signal do not occur during each of two consecutive cycle periods of the second clock signal.

16. The method of claim 9, wherein the second clock signal is received by a phase-locked loop.

* * * * *

UNITED STATES PATENT AND TRADEMARK OFFICE
CERTIFICATE OF CORRECTION

PATENT NO. : 7,084,681 B2  Page 1 of 1
APPLICATION NO. : 11/088152
DATED : August 1, 2006
INVENTOR(S) : Green et al.

It is certified that error appears in the above-identified patent and that said Letters Patent is hereby corrected as shown below:

On the title page (22), change the filing date to --Mar. 22, 2005--.

Signed and Sealed this

Fourteenth Day of November, 2006

JON W. DUDAS
*Director of the United States Patent and Trademark Office*